US006075371A

United States Patent [19]

Kitamura

[11] Patent Number: 6,075,371

[45] Date of Patent: Jun. 13, 2000

[54] LINEAR POSITION SENSOR

[75] Inventor: Takamasa Kitamura, Nagoya, Japan

[73] Assignee: Toyota Jidosha Kabushiki Kaisha, Toyota, Japan

[21] Appl. No.: 09/097,158

[22] Filed: Jun. 12, 1998

[30] Foreign Application Priority Data

Jul. 23, 1997 [JP] Japan .................................... 9-197208

[51] Int. Cl.[7] ............................ G01R 27/08; G01M 15/00

[52] U.S. Cl. .......................... 324/716; 324/714; 73/118.1

[58] Field of Search ..................................... 324/691, 695, 324/696, 713, 714, 715, 716, 723; 73/117.3, 118.1, 118.2; 123/396, 398, 399, 376, 406.52, 683, 568.19, 493; 338/118, 121, 124, 127, 128, 131, 132, 160, 171

[56] References Cited

U.S. PATENT DOCUMENTS

| | | | |
|---|---|---|---|
| 4,581,924 | 4/1986 | Otobe et al. | 73/118.1 |
| 4,693,111 | 9/1987 | Arnold et al. . | |
| 5,065,721 | 11/1991 | Wiggins et al. | 73/118.1 |
| 5,136,880 | 8/1992 | Norgauer . | |
| 5,260,877 | 11/1993 | Drobny et al. | 338/128 |
| 5,289,134 | 2/1994 | Kohr | 324/714 |

FOREIGN PATENT DOCUMENTS

| | | |
|---|---|---|
| 34 33 585 C2 | 6/1986 | Germany . |
| 40 15 415 | 11/1991 | Germany . |
| 4-214949 | 8/1992 | Japan . |
| 4-228853 | 8/1992 | Japan . |

*Primary Examiner*—Diep N. Do
*Attorney, Agent, or Firm*—Oliff & Berridge, PLC

[57] ABSTRACT

A linear position sensor has first and second output signal generators each of which outputs an output signal in accordance with the position of a detection object. As the detection object moves from an initial position, the output signal of the first output signal generator linearly increases from an output value corresponding to the initial position of the detection object. The output signal of the second output signal generator linearly increases from an output value that is greater than the output value corresponding to the initial position of the detection object. After reaching a maximum value, the output signal of the second output signal generator remains at the maximum value when the detection object further moves to a maximum displacement position. Thereby, output signal characteristics are achieved such that there always occurs a difference between the positions of the detection object indicated by the output signals from the first and second output signal generators if there occurs an abnormality such as a decrease in the supply voltage of the sensor, an increase in the ground voltage, a short circuit between the outputs of the first and second output signal generators, and the like. Based on this difference, an abnormality of the linear position sensor can be detected.

10 Claims, 10 Drawing Sheets

LINEAR POSITION SENSOR

INCORPORATION BY REFERENCE

The disclosure of Japanese Patent Application No. Hei 9-197208 filed on Jul. 23, 1997 including the specification, drawings and abstract is incorporated herein by reference in its entirety.

BACKGROUND OF THE INVENTION

1. Field of the Invention

The invention relates to a linear position sensor and, more particularly, to a linear position sensor for application to, for example, detection of the opening of a throttle valve disposed in an intake air passage of an internal combustion engine.

2. Description of Related Art

A throttle valve disposed in an intake passage of an internal combustion engine is mechanically connected by a wire and the like, to an accelerator pedal that is operated or depressed by a driver. The opening of the throttle valve is determined solely by the amount of depression of the accelerator pedal. In recent years, a so-called electronic throttle control system is also adopted in which the opening and closing of a throttle valve is controlled using an actuator, such as a motor or the like, on the basis of operating conditions of the internal combustion engine.

Such an electronic throttle control system employs a linear position sensor (hereinafter, referred to simply as "sensor") to detect the opening of the throttle valve (throttle opening). The actuator is feedback-controlled so that the throttle opening detected by the sensor becomes equal to a target throttle opening calculated on the basis of engine operating conditions.

In addition to controlling the throttle valve opening to an opening appropriate for the operating conditions of the engine, the electronic throttle control system needs to reliably detect abnormalities, if any occur, in various sensors, in particular, a sensor that detects the throttle opening or a sensor that detects the amount of depression of the accelerator pedal (accelerator depression). An abnormality in such a sensor disables the feedback control. Therefore, if a sensor abnormality occurs, the abnormality must be detected in order to stop the actuator and perform various other operations to cope with the abnormality, for example, forcible reduction of the throttle opening and the like.

For the detection of such abnormalities, a sensor has been proposed which has two output signal generator portions for generating output signals corresponding to throttle openings and allows an abnormality to be detected by comparing the output signals from the two output signal generator portions.

FIG. 11 is a schematic diagram of an example of the aforementioned sensor. A housing (not shown) of the sensor contains a base board (not shown) on which a pair of resistor patterns 100, 101 are provided. The two ends of each of the resistor patterns 100, 101 are electrically connected to a common power supply terminal 102 and a common ground terminal 103, respectively. The electric potential of the power supply terminal 102 is maintained at a supply voltage Ve (for example, 5 V), and the electric potential of the ground terminal 103 is maintained at a ground voltage VGND (0 V).

The sensor further has a rotor (not shown) that is rotatable together with the rotating shaft of a throttle valve (not shown). The rotor has a pair of electrically conductive brushes 104, 105 which contact the surfaces of the resistor patterns 100, 101, respectively. The brushes 104, 105 are connected to output terminals 107, 108, respectively. In this sensor, the brushes 104, 105 and the resistor patterns 100, 101 that are in contact with the brushes 104, 105 constitute two output signal generator portions A, B.

In the sensor constructed as described above, when the rotor is rotated together with the throttle valve, the brushes 104, 105 slide on the surfaces of the resistor patterns 100, 101. As the brushes 104, 105 slide, the voltage signals V1, V2 from the output terminals 107, 108 vary in accordance with the position of the rotor in a rotating direction, that is, the throttle opening.

FIG. 12 shows a graph indicating the relationships between the throttle opening θ and the voltage signals VI, V2 (hereinafter, referred to as "output characteristics"). In the graph, a solid line indicates the output characteristic of the output signal generator portion A, and a broken line indicates the output characteristic of the output signal generator portion B.

As indicated by the graph of FIG. 12, the voltage signals V1, V2 increase taking equal values as the throttle opening θ increases from a minimum opening θmin to a maximum opening θmax, if there is no abnormality in the output signal generator portions A, B of the sensor (it should be noted that although, in FIG. 12, the broken line is slightly above the solid line for the purpose of illustration, the two lines are actually on a single straight line).

If, for example, one of the resistor patterns 100, 101 is broken or disconnected, the voltage signals V1, V2 of the output terminals 107, 108 become different in value from each other. Therefore, this sensor is able to detect such a disconnection as a sensor abnormality.

However, the above-described sensor cannot detect an abnormality in some cases, for example, a case where the contact resistance of a connector (not shown) between the power supply terminal 102 and the power source (not shown) or a connector (not shown) between the ground terminal 103 and the ground increases resulting in a decrease in the supply voltage Ve or an increase in the ground voltage VGND.

If the supply voltage Ve of the power supply terminal 102 decreases resulting in a fall of the voltage signals V1, V2 below the normal level, or if the ground voltage VGND at the ground terminal 103 increases resulting in a rise of the voltage signals V1, V2 above the normal level, this sensor is unable to detect such an abnormality. In the sensor, a decrease in the supply voltage Ve or an increase in the ground voltage VGND does not cause the values of the voltage signals V1, V2 to differ from each other.

To solve this problem, a sensor has been proposed (see Japanese Patent Application Laid-Open No. Hei 4-214949) in which the connections between the resistor patterns 100, 101 and the terminals 102, 103 are modified as shown in FIG. 13, so that the rates of change k1, k2 of the voltage signals V1, V2 relative to changes in the throttle opening θ ($k1=dV1/d\theta$, $k2=dV2/d\theta$) become positive ($k1>0$) and negative ($k2<0$), respectively, as indicated in FIG. 14.

By setting such output characteristics of the output signal generator portions A, B, it becomes possible to detect a decrease in the supply voltage Ve or an increase in the ground voltage VGND as an abnormality. If the supply voltage Ve decreases as indicated by arrows in FIG. 14, the output signal generator portion A outputs a signal indicating a throttle opening θa and the output signal generator portion B outputs a signal indicating a throttle opening θb when the actual throttle opening θ is an opening θj. Since there is a difference $\Delta\theta$ between the openings $\theta a$ and $\theta b$ ($\Delta\theta=\theta a-\theta b<0$) as indicated in FIG. 14, a sensor abnormality can be detected on the basis of determination as to whether the absolute value of the difference $\Delta\theta$ is greater than a predetermined criterion.

Likewise, if the ground voltage VGND increases as indicated in FIG. 15, a difference $\Delta\theta$ exists between the openings $\theta a$ and $\theta b$ detected by the output signal generator portions A and B, that is, $\Delta\theta=\theta a-\theta b>0$. Therefore, an increase in the ground voltage VGND can also be detected as an abnormality based on the absolute value of the difference $\Delta\theta$.

However, this sensor also has problems. If both voltage signals V1, V2 change to an intermediate value between the supply voltage Ve and the ground voltage VGND (that is, (Ve+VGND)/2) due to, for example, short circuit of the output terminals 107, 108 or the resistor patterns 100, 101, the difference $\Delta\theta$ becomes "0", so that the sensor cannot detect this abnormality. That is, in a range where the characteristic lines of the output signal generator portions A and B intersect each other, the difference $\Delta\theta$ between the openings $\theta a$ and $\theta b$ corresponding to the voltage signals obtained by the output signal generator portions A and B becomes "0", so that abnormality detection is impossible.

Moreover, in the aforementioned sensors, repeated slides of the brushes 104, 105 on the resistor patterns 100, 101 will gradually abrade the surfaces of the resistor patterns 100, 101, forming abrasion powder having a predetermined conductivity. If such abrasion powder deposits on the brushes 104, 105, the contact resistance between the brushes 104, 105 and the resistor patterns 100, 101 will increase. The problem of increases in contact resistance is inevitable in the sensors having aforementioned constructions. In these sensors, therefore, it is necessary to allow for fluctuations of the voltage signals due to contact resistance increases while designing a construction to detect sensor abnormalities.

FIGS. 16 and 17 show electric circuit diagrams of the output signal generator portion A. As shown in FIGS. 16 and 17, the output terminal 107 of the output signal generator portion A is connected to an A/D converter of an electronic control unit (not shown), with a pull-down resistor 120 connected therebetween. Although not shown, the output terminal 108 of the output signal generator portion B is also connected to an A/D converter, with a pull-down resistor connected therebetween. In FIGS. 16 and 17, the contact resistance between the brush 104 and the resistor pattern 100 is represented by a resistor r that is disposed between the brush 104 and the output terminal 107.

If the throttle opening $\theta$ is a maximum opening $\theta max$, the brush 104 is at a position on the resistor pattern 100 that is the nearest to the power supply terminal 102 as indicated in FIG. 16. Therefore, the resistance provided between the power supply terminal 102 and the brush 104 by the resistor pattern 100 becomes minimum, so that the voltage fluctuation (voltage fall) $\Delta V$ across the contact resistor r relatively becomes maximum.

Conversely, if the throttle opening $\theta$ is a minimum opening $\theta min$, the brush 104 is at a position on the resistor pattern 100 that is the farthest from the power supply terminal 102 as indicated in FIG. 17. Therefore, the resistance provided between the power supply terminal 102 and the brush 104 by the resistor pattern 100 becomes maximum, so that the voltage fluctuation (voltage fall) $\Delta V$ by the contact resistor r relatively becomes minimum.

Thus, in the sensor in which the output signal generator portions A, B have opposite output characteristics, the voltage fluctuation by the contact resistance r has a great effect on the voltage signal V2 of the output signal generator portion B if the throttle opening $\theta$ is relatively small. If the throttle opening $\theta$ is relatively large, the voltage fluctuation by the contact resistance r has a great effect on the voltage signal V1 of the output signal generator portion A.

Therefore, the aforementioned sensor needs to perform detection of sensor abnormalities while allowing for a maximum voltage fluctuation by the contact resistance r, that is, setting a relatively large criterion value for the detection of a sensor abnormality. As a result, the sensor has a problem of incapability of detecting a sensor abnormality with a high precision.

SUMMARY OF THE INVENTION

Accordingly, it is an object of the present invention to provide a linear position sensor that allows an improvement in the precision in detection of a sensor abnormality.

According to a first aspect of the invention, there is provided a linear position sensor including at least two output signal generator portions each having a resistor band, and a slider provided for a sliding movement on the resistor band that follows a positional change of a detection object. Each output signal generator portion outputs a voltage signal in accordance with a position of the detection object using the slider. The resistor band of each output signal generator portion is connected at an end thereof to a power source, and the other end of the resistor band is grounded. A first output signal generator portion of the at least two output signal generator portions has an output signal characteristic relative to a positional change of the detection object such that the voltage signal outputted from the first output signal generator portion linearly increases from a ground voltage to a supply voltage of the power source as the detection object changes in position in a predetermined direction. A second output signal generator portion of the at least two output signal generator portions has an output signal characteristic relative to a positional change of the detection object such that as the detection object changes in position in the predetermined direction, the voltage signal outputted from the second output signal generator portion linearly increases to the supply voltage of the power source and, after that, remains at the supply voltage despite a further positional change of the detection object in the predetermined direction.

According to a second aspect of the invention, there is provided a linear position sensor including at least two output signal generator portions and a detection portion. Each output signal generator portion has a resistor band, and a slider provided for sliding movement on the resistor band that follows a positional change of a detection object. Each output signal generator portion outputs a voltage signal in accordance with a position of the detection object using the slider. The resistor band of each output signal generator portion is connected at an end thereof to a power source, and the other end of the resistor band is grounded. A first output signal generator portion of the at least two output signal generator portions has an output signal characteristic relative to a positional change of the detection object such that the voltage signal outputted from the first output signal generator portion linearly increases from a ground voltage to a supply voltage of the power source as the detection object changes in position in a predetermined direction. A second output signal generator portion of the at least two output signal generator portions has an output signal characteristic relative to a positional change of the detection object such that as the detection object changes in position in the predetermined direction, the voltage signal outputted from the second output signal generator portion linearly increases to the supply voltage of the power source and, after that, remains at the supply voltage despite a further positional change of the detection object in the predetermined direction. The detection portion detects an abnormality of the linear position sensor by comparing positions of the detection object corresponding to the voltage signals from the at least two output signal generator portions.

In the linear position sensor according to the first aspect of the invention, the voltage signal may increase to the supply voltage in accordance with a positional change of the detection object from an initial position. This construction makes it possible to detect an abnormality with a high precision on the basis of the output signals from the output signal generator portions when the detection object is near the initial position, even if there is a contact resistance between the resistor band and the slider.

In the first aspect of the invention, one end of the resistor pattern of each output signal generator portion may be connected to a common power source. With this construction, if the supply voltages to the output signal generator portions are different from each other, the positions of the detection object corresponding to the voltage signals outputted from the output signal generator portions are different from each other, so that an abnormality of the linear position sensor can be detected with a high precision.

Furthermore, in the first aspect of the invention, as the detection object changes in position in the predetermined direction, the voltage signal outputted from the second output signal generator portion may linearly increase from a voltage higher than the ground voltage to the supply voltage while always remaining greater in value than the voltage signal outputted from the first output signal generator portion. With this construction, if the supply voltage decreases, the positions of the detection object corresponding to the voltage signals from the output signal generator portions become different from each other, so that an abnormality of the linear position sensor can be detected with a high precision.

In the first aspect of the invention, as the detection object changes in position in the predetermined direction, the voltage signal outputted from the second output signal generator portion may linearly increase to the supply voltage at a linear change rate that is greater than a linear change rate of the voltage signal outputted from the first output signal generator portion. With this construction, if the ground voltage increases, the positions of the detection object corresponding to the voltage signals from the output signal generator portions become different from each other, so that an abnormality of the linear position sensor can be detected with a high precision.

In the first aspect of the invention, the linear position sensor may be used to detect an opening of a throttle valve that is used to control an output of an internal combustion engine. Furthermore, the voltage signal outputted from the second output signal generator portion may remain at the supply voltage when the throttle valve moves from a position corresponding to a predetermined opening that is less than a maximum opening, toward a position corresponding to the maximum opening. This construction makes it possible to quickly detect an abnormality when the opening of the throttle valve used for adjusting the intake air flow is in a relatively small opening range, where the output of the engine tends to change in a great amount.

Thus, the invention allows detection of various abnormalities and reduces the influence of the voltage fluctuation caused by the contact resistance between the resistor bands and the sliders. Therefore, it becomes possible to improve the precision in the abnormality detection by the linear position sensor.

BRIEF DESCRIPTION OF THE DRAWINGS

The foregoing and further objects, features and advantages of the present invention will become apparent from the following description of preferred embodiments with reference to the accompanying drawings, wherein like numerals are used to represent like elements and wherein.

DETAILED DESCRIPTION OF PREFERRED EMBODIMENTS

Preferred embodiments of the present invention in which the linear position sensor of the invention is embodied as a throttle sensor for detecting the opening of a throttle valve disposed in an engine will be described in detail hereinafter with reference to the accompanying drawings.

Figure 2:
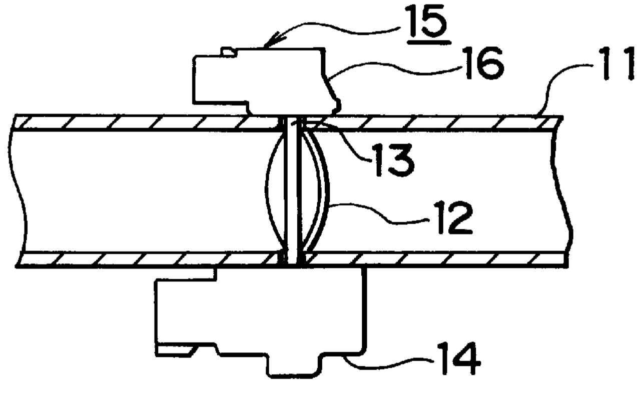
FIG. 2 is a sectional view of an intake pipe of an engine in which a throttle valve is disposed.

FIG. 2 is a sectional view of a portion of an intake pipe 11 of an engine (not shown). Provided in the intake pipe 11 is a throttle valve 12 for adjusting the amount of intake air to be introduced into a combustion chamber of the engine, that is, the intake air flow. A rotating shaft 13 of the throttle valve 12 is coupled at its one end (lower end in FIG. 2) to an output shaft (not shown) of a motor 14 that is mounted on an outer wall surface of the intake pipe 11. The motor 14 is driven on the basis of output signals from an engine electronic control unit (not shown). By operating the motor 14, the throttle valve 12 is opened and closed to adjust the opening of the throttle valve 12 (throttle opening θ).

A throttle sensor 15 is mounted on the outer wall surface of the intake pipe 11, opposite from the motor 14. The other end of the rotating shaft 13 is positioned in a housing 16 of the throttle sensor 15. The electronic control unit receives output signals from the throttle sensor 15, and detects the throttle opening θ based on the signals, and feedback-controls the motor 14 so that the throttle opening θ becomes equal to a target opening.

Figure 1:
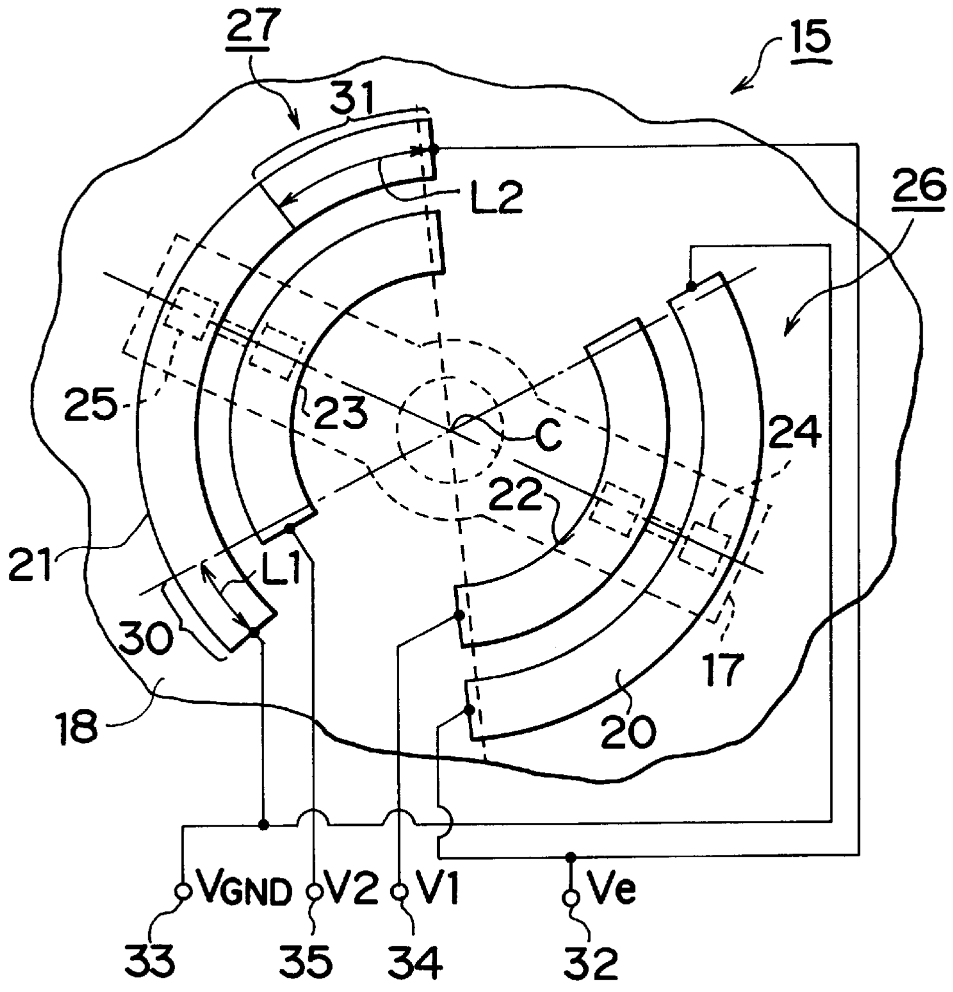
FIG. 1 is a schematic diagram illustrating the construction of a throttle sensor according to the invention.

The throttle sensor 15 will now be described. As shown in FIG. 1, the throttle sensor 15 has a rotor 17 that is disposed in the housing 16 (shown in FIG. 2) for rotational movements together with the rotating shaft 13, and a base board 18 also disposed in the housing 16 and facing the rotor 17.

A pair of resistor patterns 20, 21 and a pair of conductor patterns 22, 23 are provided on the base board 18. The resistor patterns 20, 21 have a generally arc shape, and are disposed on a surface of the base board 18, respectively extending on opposite sides of a rotation center C of the rotor 17, that is, extending roughly symmetrically about the rotation center C. Similar to the resistor patterns 20, 21, the conductor patterns 22, 23 have a generally arc shape, and are disposed on the surface of the base board 18, extending along the inner peripheries of the corresponding resistor patterns 20, 21, that is, radially inward of the resistor patterns 20, 21.

Brushes 24, 25 each formed of a bundle of metal wires are provided on a surface of the rotor 17 that faces the base board 18. The brushes 24, 25 are disposed substantially symmetrically about the rotation center C. Each of the brushes 24, 25 contacts both the corresponding resistor pattern 20 or 21 and the corresponding conductor pattern 22 or 23, extending therebetween. When the rotor 17 is rotated, the brushes 24, 25 move along the patterns 20–23, sliding thereon. In FIG. 1, the rotor 17 and the brushes 24, 25 are indicated by broken lines.

The brushes 24, 25 are slidingly movable over the resistor and conductor patterns 20–23 between a position indicated by two-dotted line in FIG. 1 (hereinafter, referred to as "first position") and a position indicated by a broken line (hereinafter, referred to as "second position"). When the brushes 24, 25 reach the first position, the throttle valve 12 becomes a completely closed state where the throttle opening θ becomes the minimum opening θmin. When the brushes 24, 25 reach the second position, the throttle opening θ becomes the maximum opening θmax. The throttle is designed so that the throttle opening θis normally varied between the minimum opening θmin and a predetermined opening θk (described below) that is less than the maximum opening θmax.

In the throttle sensor 15, the resistor and conductor patterns 20, 22 and the brush 24 in contact therewith, which are to the right of the rotation center C in FIG. 1, form a first output signal generator portion 26. The resistor and conductor patterns 21, 23 and the brush 25 in contact therewith, which are to the left of the rotation center C in FIG. 1, form a second output signal generator portion 27.

In a first embodiment of the invention, the resistor pattern 21 of the second output signal generator portion 27 has an extension 30 that extends counterclockwise from a lower end (in FIG. 1) of the resistor pattern 21, that is, an end thereof corresponding to the first position regarding the brush 25. Furthermore, an upper end portion of the resistor pattern 21 is formed from a conductor material and thus forms a conducting portion 31.

The upper end of the resistor pattern 21 of the second output signal generator portion 27, that is, the upper end of the conducting portion 31, is electrically connected to a power supply terminal 32 disposed on the base board 18. The lower end of the resistor pattern 20 of the first output signal generator portion 26 is also electrically connected to the power supply terminal 32. The power supply terminal 32 is connected to a drive circuit (not shown) of the electronic control unit. The electric potential of the power supply terminal 32 is maintained at a constant supply voltage Ve (for example, 5 V). Therefore, the electric potential of the conducting portion 31 always equals the supply voltage Ve regardless of locations on the conducting portion 31.

In contrast, the lower end of the resistor pattern 21 of the second output signal generator portion 27, that is, the lower end of the extension 30, and the upper end of the resistor pattern 20 of the first output signal generator portion 26 are connected to a ground terminal 33 disposed on the base board 18. The ground terminal 33 is grounded so that the electric potential thereof is maintained at a ground voltage VGND (0 V).

A first output terminal 34 and a second output terminal 35 are provided on the base board 18. The conductor pattern 22 of the first output signal generator portion 26 is electrically connected to the first output terminal 34. The conductor pattern 23 of the second output signal generator portion 27 is electrically connected to the second output terminal 35. The output terminals 34, 35 are connected to A/D converters (not shown), with pull-down resistors (not shown) connected therebetween, as described above. Voltage signals in accordance with the throttle opening θ are outputted from the output terminals 34, 35 to the electronic control unit.

The output characteristics of the throttle sensor 15 will next be described in conjunction with a case where the throttle opening θ is increased from the minimum opening θmin to the maximum opening θmax, with reference to FIG. 3.

When the throttle opening θ is the minimum opening θmin, the brushes 24, 25 are positioned at the first position as described above. Therefore, the voltage signal V1 from the first output terminal 34 (the voltage signal of the first output signal generator portion 26) equals the ground voltage VGND, that is, 0 V, as indicated by a solid line in FIG. 3, and the voltage signal V2 of the second output terminal 35 (the voltage signal of the second output signal generator portion 27) equals a voltage Voff that is higher by a predetermined value than the ground voltage VGND (hereinafter, referred to as "offset voltagez") as indicated by a broken line in FIG. 3. The offset voltage Voff corresponds to a voltage fall caused by the extension 30 of the resistor pattern 21. The magnitude of the offset voltage Voff increases with increases in the ratio of the length L1 of the extension 30 to the entire length of the resistor pattern 21.

As the throttle opening θ is increased from the minimum opening θmin, the brushes 24, 25 turn clockwise (in FIG. 1) from the first position together with the rotation of the rotor 17. As the brushes 24, 25 are thus moved, the voltage signals V1, V2 of the first output signal generator portion 26 and the second output signal generator portion 27 linearly increase in magnitude in accordance with increases in the throttle opening θ.

In the throttle sensor 15 in the first embodiment, the rate of change k2 of the voltage signal V2 of the second output signal generator portion 27 relative to changes in the throttle opening θ is set to a value that is greater than the value of the rate of change k1 of the voltage signal V1 of the first output signal generator portion 26 relative to changes in the throttle opening θ (k1=dV1/dθ, k2=dV2/dθ). Therefore, the value of the voltage signal V2 of the second output signal generator portion 27 is always greater than the value of the voltage signal V1 of the first output signal generator portion 26 over the variation ranges thereof.

Furthermore, when the throttle opening θ is increased to or above a predetermined opening θk, the brush 25 of the second output signal generator portion 27 comes to slide on the surface of the conducting portion 31. Since the electric potential of the conducting portion 31 always equals the supply voltage Ve, the voltage signal V2 of the second output signal generator portion 27 stops increasing. That is, in a range above the predetermined opening θk, only the voltage signal V1 of the first output signal generator portion 26 increases.

When the throttle opening θ reaches the maximum opening θmax, the brushes 24, 25 reach the second position (indicated by the broken line in FIG. 1), where the voltage signals V1, V2 of the first and second output signal generator portions 26, 27 are equal to the supply voltage Ve.

In this manner, the throttle sensor 15 of this embodiment outputs the voltage signals V1, V2 in accordance with the size of the throttle opening θ, from the first and second output signal generator portion 26, 27 to the electronic control unit. Therefore, the electronic control unit can detect the throttle opening θ based on the magnitudes of the voltage signals V1, V2.

When the throttle opening θ is within a predetermined range (θmin<θ<θmax), it is possible to detect various abnormalities that may occur in the throttle sensor 15 by the electronic control unit comparing the voltage signals V1, V2 from the output signal generator portions 26, 27. Although the operations of the electronic control unit for determining whether there are any abnormalities will not be described herein, the methods for detection various abnormalities performed by the throttle sensor 15 will be described.

Figure 4:
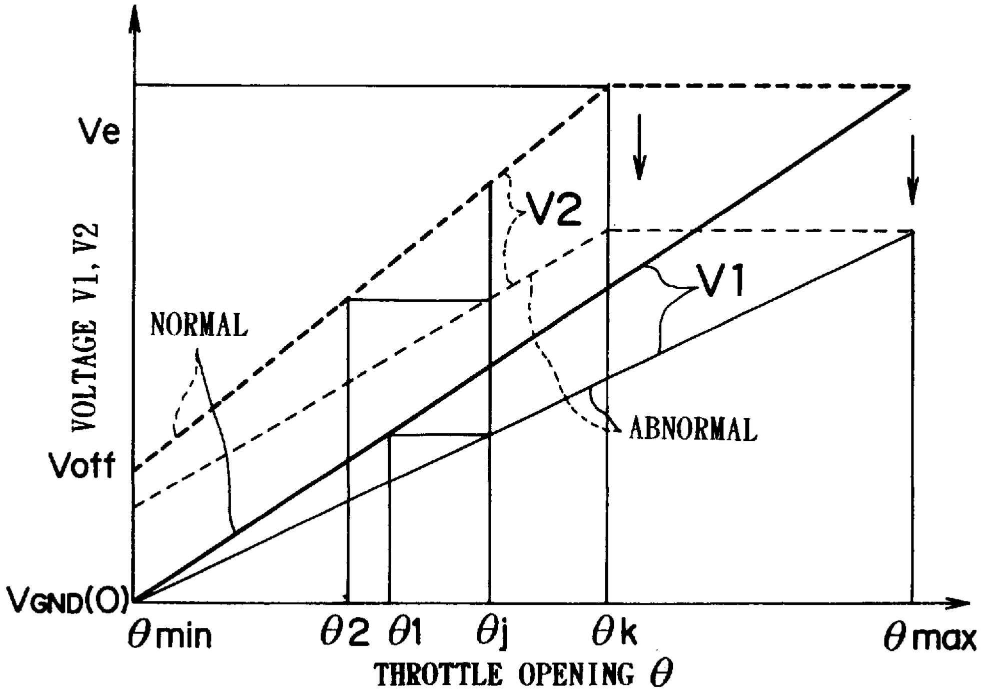
FIG. 4 is a graph indicating the relationships between the throttle opening and the voltage signals where there is a decrease in the supply voltage in the first embodiment.

If a decrease in the supply voltage Ve at the power supply terminal 32 occurs, the voltage signals of the output signal generator portions 26, 27 decrease below the normal voltages as indicated in FIG. 4, so that the voltage signals V1, V2 outputted from the output signal generator portions 26, 27 correspond to (or indicate) throttle openings θ that are different from the actual throttle opening θ, based on the preset characteristic lines. That is, when the actual throttle opening θ is an opening θj (θmin<θj<θk), the first output signal generator portion 26 outputs a voltage signal that corresponds, based on the preset characteristic line, to an opening θ1(<θj) instead of the actual throttle opening θj, and the second output signal generator portion 27 outputs a voltage signal that corresponds, based on the preset characteristic line, to an opening θ2(<θj) that is smaller than the opening θ1. Thus, there always exists a difference Δθ between the openings θ1 and θ2 (Δθ=θ1−θ2>0) as indicated in FIG. 4, so that an abnormality of the throttle sensor 15 can be detected on the basis of the magnitude of the difference Δθ. For this abnormality detection, for example, the electronic control unit compares the difference Δθ with a predetermined criterion value. If the difference Δθ is greater than the criterion value, the electronic control unit determines that an abnormality has occurred in the throttle sensor 15.

Figure 5:
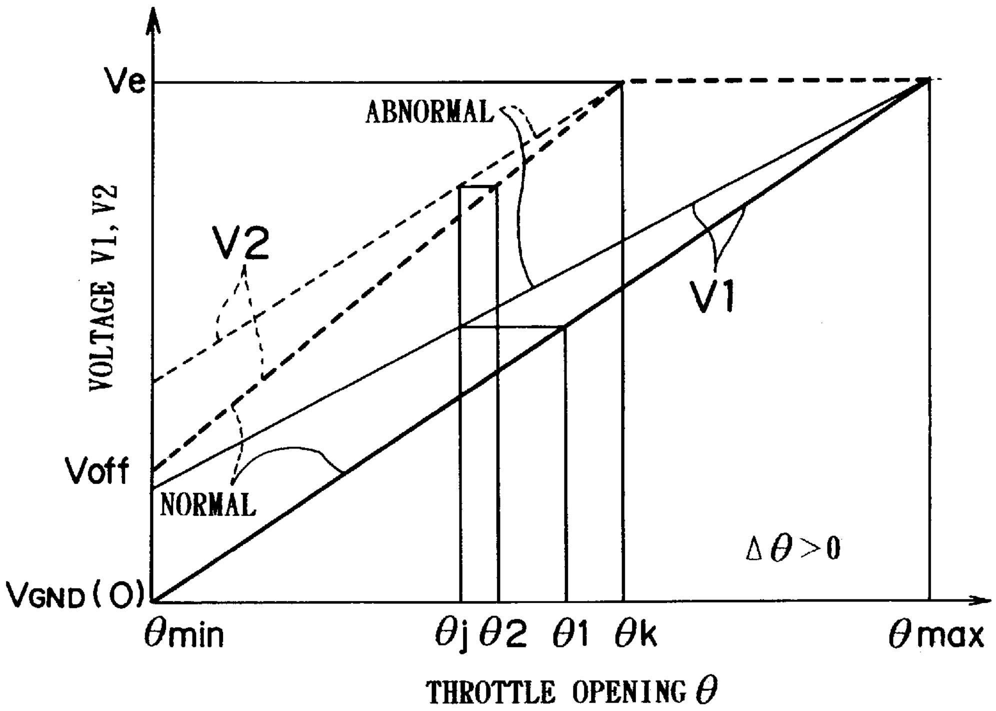
FIG. 5 is a graph indicating the relationships between the throttle opening and the voltage signals where there is an increase in the ground voltage in the first embodiment.

If the ground voltage VGND at the ground terminal 33 increases, the voltage signal of the output signal generator portions 26, 27 change as indicated in FIG. 5. In this case, when the actual throttle opening θ is an opening θj, the first output signal generator portion 26 outputs a voltage signal corresponding to an opening θ1 (>θj) instead of the actual throttle opening θj, and the second output signal generator portion 27 outputs a voltage signal corresponding to an opening θ2 (>θj). There always exists a difference Δθ between the openings θ1 and θ2 (Δθ=θ1−θ2>0) as indicated in FIG. 5, so that an abnormality of the throttle sensor 15 can be detected on the basis of the magnitude of the difference Δθ.

Figure 6:
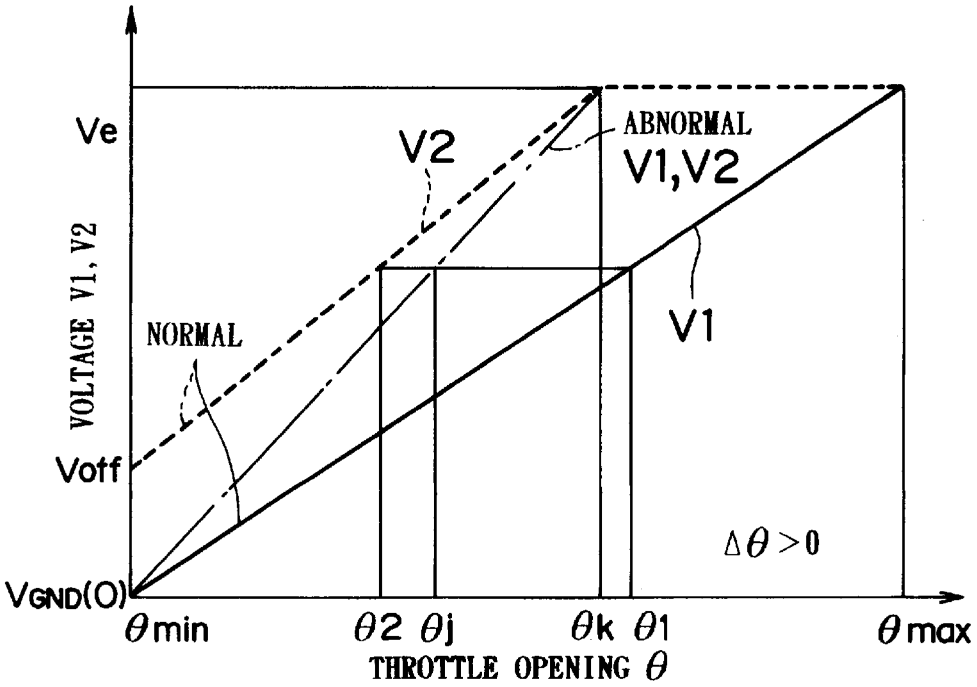
FIG. 6 is a graph indicating the relationships between the throttle opening and the voltage signals where there is a short circuit of an output terminal in the first embodiment.

If a short circuit occurs between the output terminals 34 and 35 of the output signal generator portions 26 and 27, the voltage signals of the output signal generator portions 26, 27 always equal each other, and vary as indicated by a one-dot line in FIG. 6. In this case, when the actual throttle opening θ is an opening θj, the first output signal generator portion 26 outputs a voltage signal corresponding to an opening θ1 (>θj) instead of the actual throttle opening θj, and the second output signal generator portion 27 outputs a voltage signal corresponding to an opening θ2 (<θj). Thus, there always exists a difference Δθ between the openings θ1 and θ2 (Δθ=θ1−θ2>0) as indicated in FIG. 6, so that an abnormality of the throttle sensor 15 can be detected on the basis of the magnitude of the difference Δθ.

In short, since in the output characteristics of the throttle sensor 15 in the first embodiment, the characteristic line of the voltage signal V2 of the second output signal generator portion 27 is always above the characteristic line of the voltage signal V1 of the first output signal generator portion 26 over a range (θmin<θ<θk) of the throttle opening θ where an abnormality can be detected, the voltage signals V1, V2 never become equal to each other unless an abnormality occurs. Therefore, if the voltage signals V1, V2 become equal to each other due to a short circuit between the output terminals 34 and 35, that abnormality can be detected.

Another construction as described below may also be employed to detect an abnormality where the output terminals 34 and 35 forms a short circuit.

Figure 7:
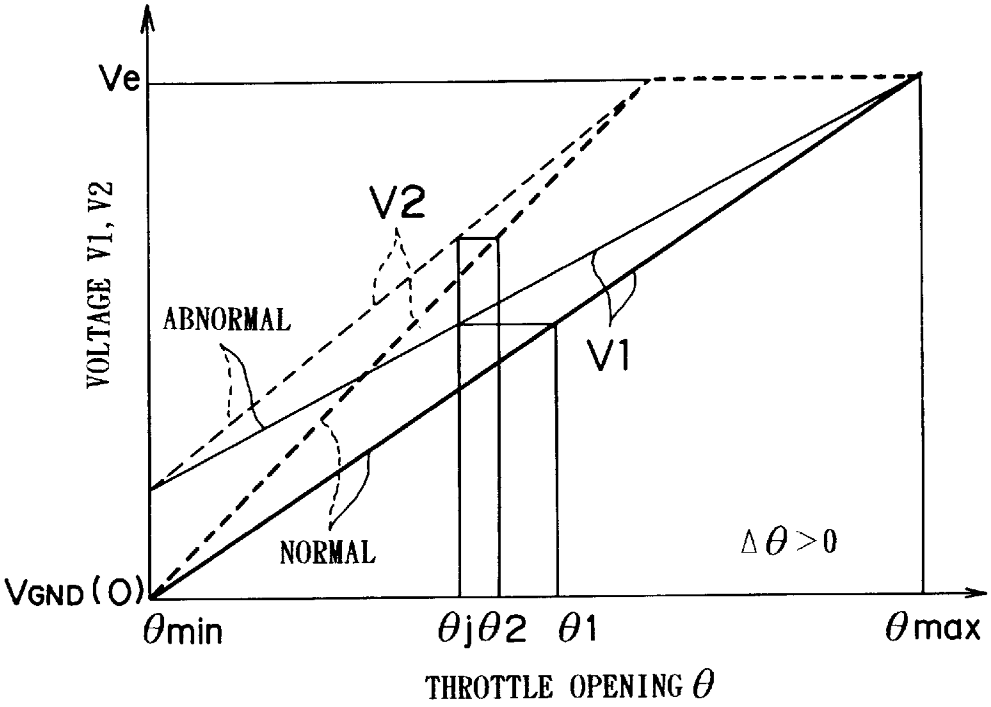
FIG. 7 is a graph indicating the relationships between the throttle opening and the voltage signals where there is an increase in the ground voltage in a second embodiment of the invention.

According to a second embodiment of the invention, the output characteristic of the second output signal generator portion 27 is set such that, as indicated in FIG. 7, the voltage signal V2 of the second output signal generator portion 27 linearly increases from the ground voltage VGND to the supply voltage Ve as the throttle opening θ increases from the minimum opening θmin to the predetermined opening θk, and such that the voltage signal V2 is maintained at the supply voltage Ve when the throttle opening θ increases from the predetermined opening θk to the maximum opening θmax. This setting of the output characteristics also makes it possible to detect the short circuit between the output terminals 34 and 35 as an abnormality.

This setting of the output characteristics of the throttle sensor according to this embodiment can be achieved by omitting the extension 30 from the construction of the throttle sensor 15 according to the first embodiment. The second embodiment also makes it possible to detect an abnormality where there is an increase in the ground voltage VGND. In this case, when the actual throttle opening θ is an opening θj, the first output signal generator portion 26 outputs a voltage signal corresponding to an opening θ1 (>θj) instead of the actual throttle opening θj as indicated in FIG. 7, and the second output signal generator portion 27 outputs a voltage signal corresponding to an opening θ2 (>θj). There always exists a difference Δθ between the openings θ1 and θ2 (Δθ=θ1−θ2>0), so that an abnormality of the throttle sensor 15 can be detected on the basis of the magnitude of the difference Δθ.

Figure 8:
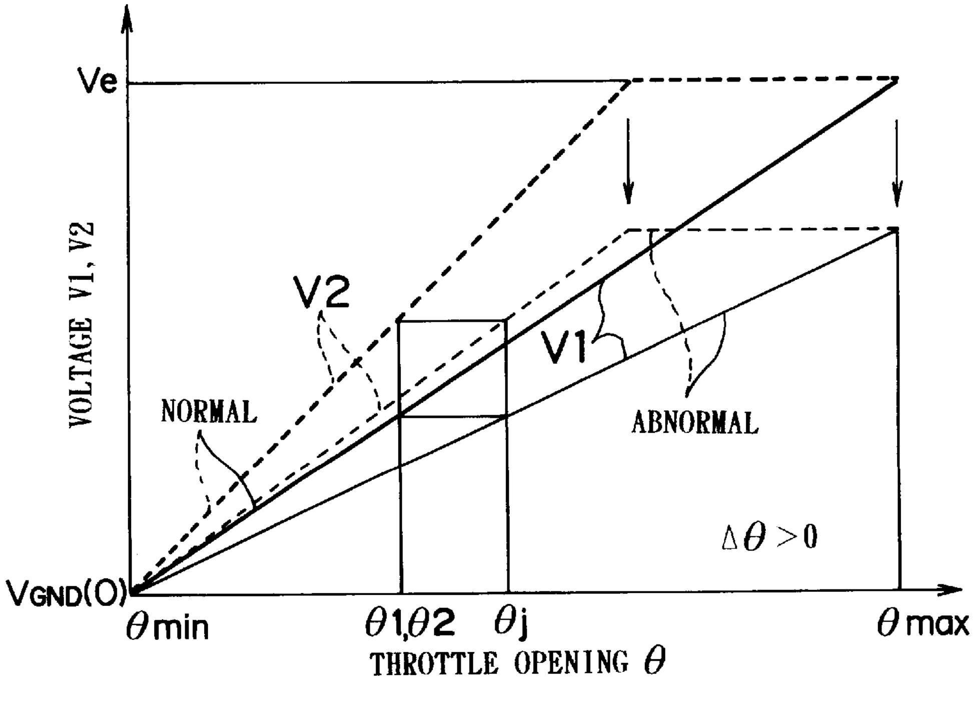
FIG. 8 is a graph indicating the relationships between the throttle opening and the voltage signals where there is a decrease in the supply voltage in the second embodiment.

In the second embodiment, if the supply voltage Ve at the power supply terminal 32 decreases so that the voltage values V1, V2 decrease below the normal voltage values, no difference Δθ occurs between the indicated throttle openings despite the decrease in the supply voltage Ve, as indicated in FIG. 8. Therefore, from comparison between the second embodiment and the first embodiment, it should be apparent that a decrease in the supply voltage Ve can be detected as an abnormality by providing the resistor pattern 21 of the second output signal generator portion 27 with the extension 30 so that the voltage signal V2 of the second output signal generator portion 27 becomes an offset voltage Voff that is higher than the ground voltage VGND when the throttle opening θ is the minimum opening θmin.

Therefore, the throttle sensor 15 of the first embodiment makes it possible to detect as an abnormality of the throttle sensor 15 any one of a short circuit between the output terminals 34 and 35, a decrease in the supply voltage Ve and an increase in the ground voltage VGND, thereby improving the precision in detecting an abnormality of the throttle sensor 15.

Figure 3:
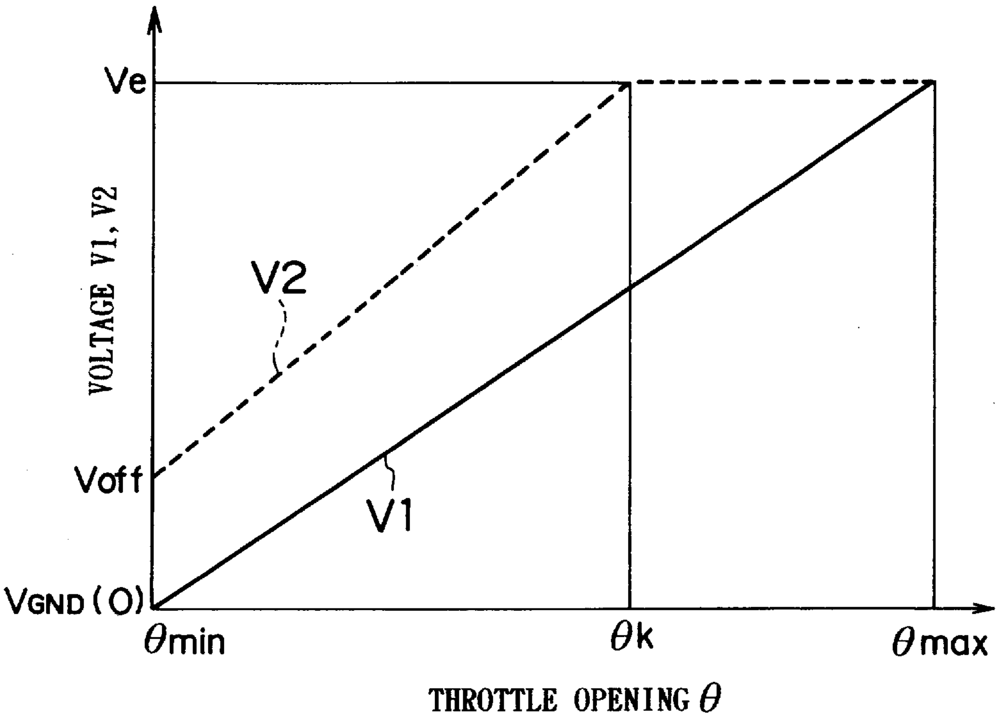
FIG. 3 is a graph indicating the relationships between the throttle opening and the voltage signals according to a first embodiment of the invention.

Furthermore, in the first embodiment, the rates of change k1, k2 of the voltage signals V1, V2 relative to changes in the throttle opening θ are set to positive values (k1, k2>0) as indicated in FIG. 3. In other words, when the throttle opening θ is in a relatively small opening range, the brushes 24, 25 are positioned relatively near to the first position, that is, the values of resistance provided between the brushes 24, 25 and the power supply terminal 32 by the resistor patterns 20, 21 become relatively large. Therefore, even if there occurs a contact resistance between the brushes 24, 25 and the resistor and conductor patterns 20–23, the fluctuations in the voltage caused by the contact resistance become relatively small, that is, the influence of the voltage fluctuations on the voltage signals V1, V2 of the output signal generator portions 26, 27 become relatively small when the throttle opening θ is relatively small. Consequently, the first embodiment makes it possible to use a relatively small criterion value when the throttle opening θ is in a relatively small opening range, thereby allowing abnormality detection with a further improved precision.

Figure 9:
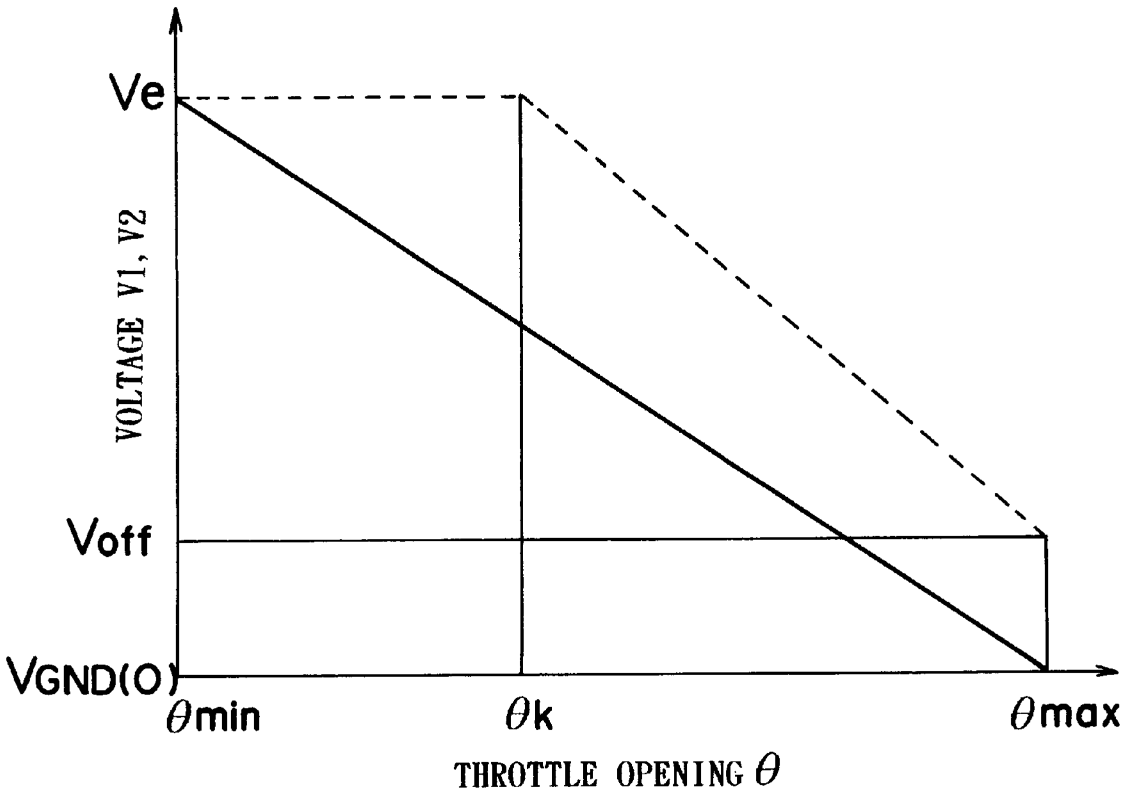
FIG. 9 is a graph indicating the relationships between the throttle opening and the voltage signals in a third embodiment of the invention.

A third embodiment of the invention has a construction that is obtained by changing the construction shown in FIG. 1, more specifically, by replacing the power supply terminal 32 with a ground terminal and the ground terminal 33 with a power supply terminal. The construction of the third embodiment achieves output characteristics of the throttle sensor 15, as indicated in FIG. 9, in which the voltage signal V1 of the first output signal generator portion 26 decreases from the supply voltage Ve to the ground voltage VGND as the throttle opening θ increases from the minimum opening θmin to the maximum opening θmax, and the voltage signal V2 of the second output signal generator portion 27 remains at the supply voltage Ve when the throttle opening θ increases from the minimum opening θmin to the predetermined opening θk, and the voltage signal V2 decreases to the offset voltage Voff as the throttle opening θ increases from the predetermined opening θk to the maximum opening θmax. Conversely to the throttle sensor 15 of the first embodiment, the throttle sensor 15 of the third embodiment makes it possible to use a relatively small criterion value when the throttle opening θ is in a relatively large opening range, thereby allowing abnormality detection with an improved precision in such a case.

In adjustment of the intake air flow by the throttle valve 12, there normally is a tendency that as the throttle opening θ becomes smaller, the rate of change (=dQ/dθ) of the intake air flow (Q) relative to the throttle opening θ becomes greater and, therefore, the change in the engine output becomes greater. Therefore, if an abnormality occurs when the throttle opening θ is in a relatively small opening range, it is desirable that the abnormality be promptly and accurately detected.

The third embodiment is advantageous in this respect. That is, since the throttle sensor 15 of this embodiment allows an abnormality to be detected with an improved precision particularly when the throttle opening θ is relatively small, it becomes possible to promptly and accurately detect an abnormality when the throttle opening θ is relatively small. That is, the throttle sensor 15 according to this embodiment is suitable as a sensor for detecting the opening of a throttle valve of an engine.

Furthermore, in the throttle sensor 15 according to the first embodiment, the output characteristics are set so that the rate of change k2 of the voltage signal V2 of the second output signal generator portion 27 relative to changes in the throttle opening θ is greater than the rate of change k1 of the voltage signal V1 of the first output signal generator portion 26 relative to changes in the throttle opening θ when the throttle opening θ is in a range between the minimum opening θmin and the predetermined opening θk.

Figure 10:
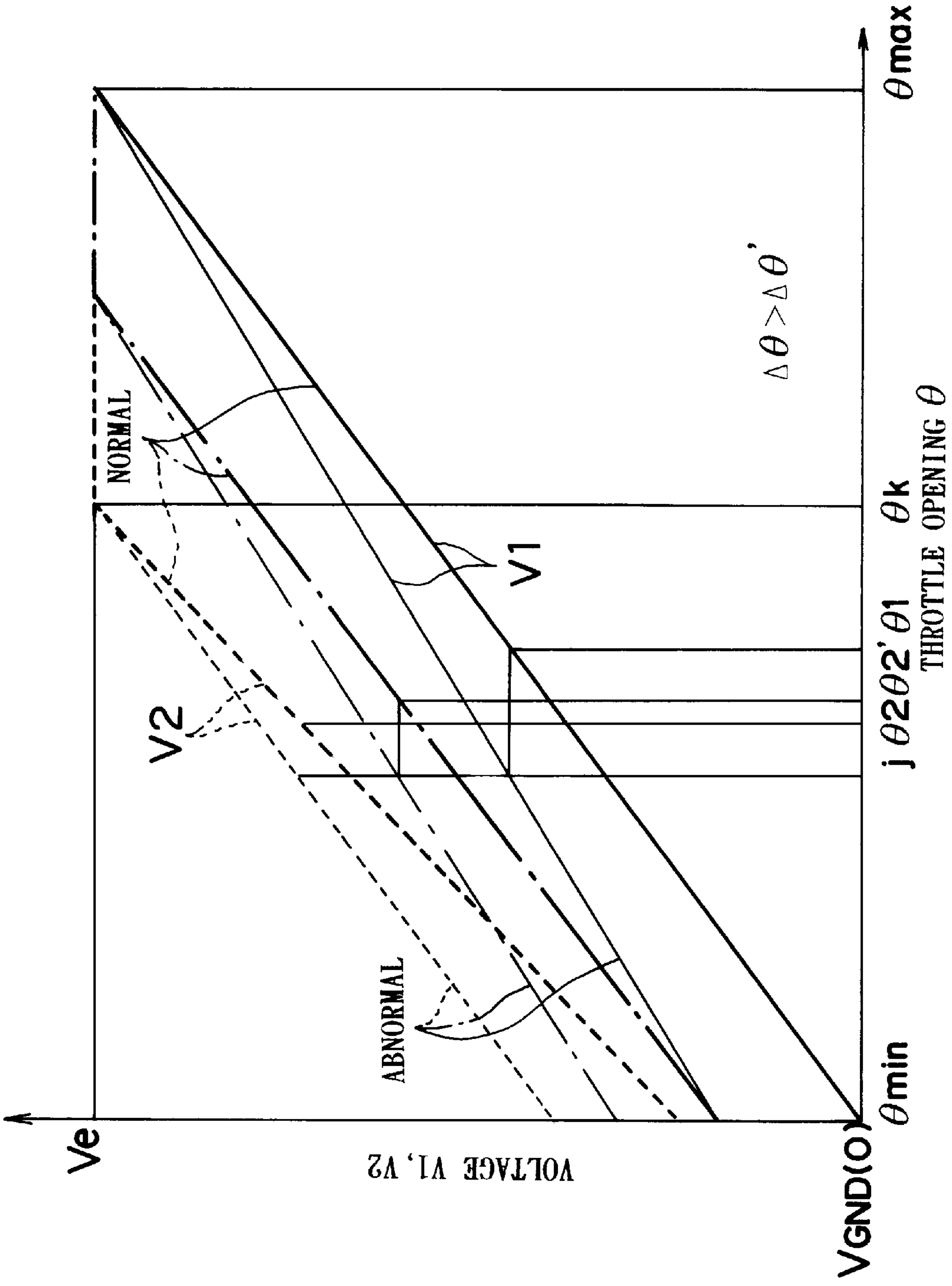
FIG. 10 is a graph indicating the relationships between the throttle opening and the voltage signals where there is an increase in the ground voltage in the third embodiment.
Figure 11:
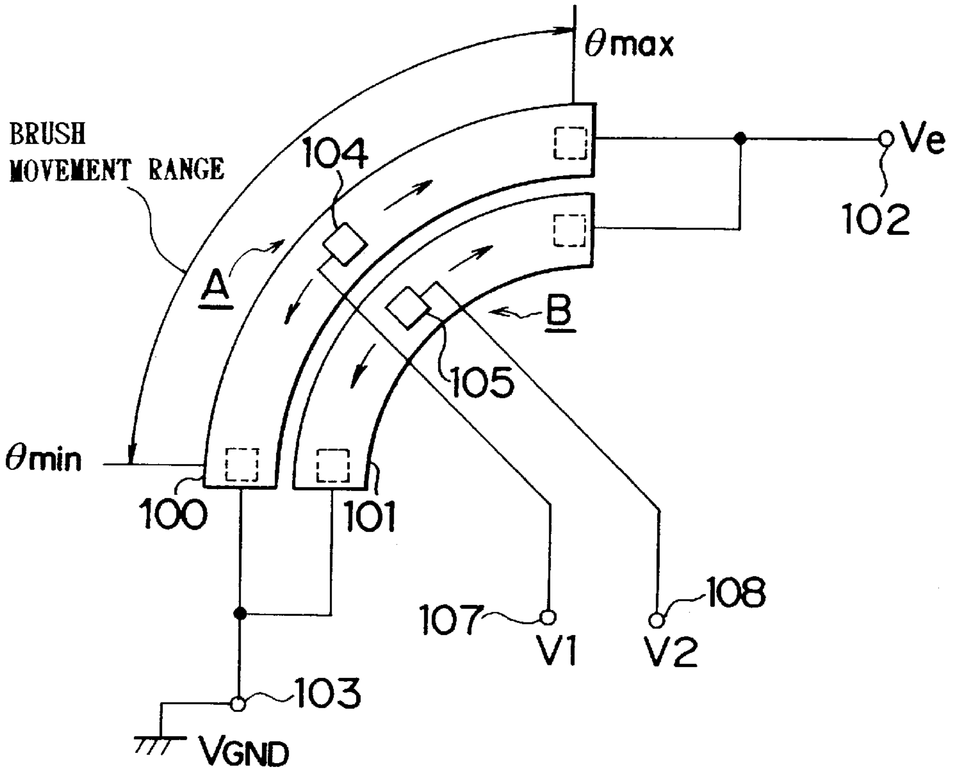
FIG. 11 RELATED ART
FIG. 11 is a schematic diagram of a throttle sensor according to a related art technology.
Figure 12:
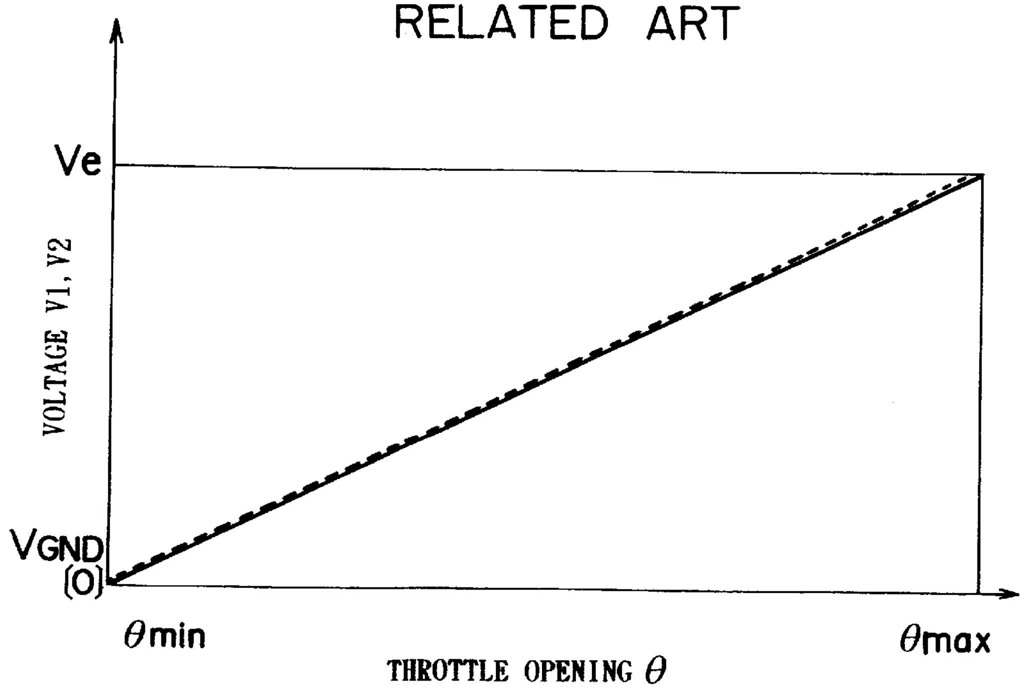
FIG. 12 RELATED ART
FIG. 12 is a graph indicating the relationship between the throttle opening and the voltage signals in the related art throttle sensor.
Figure 13:
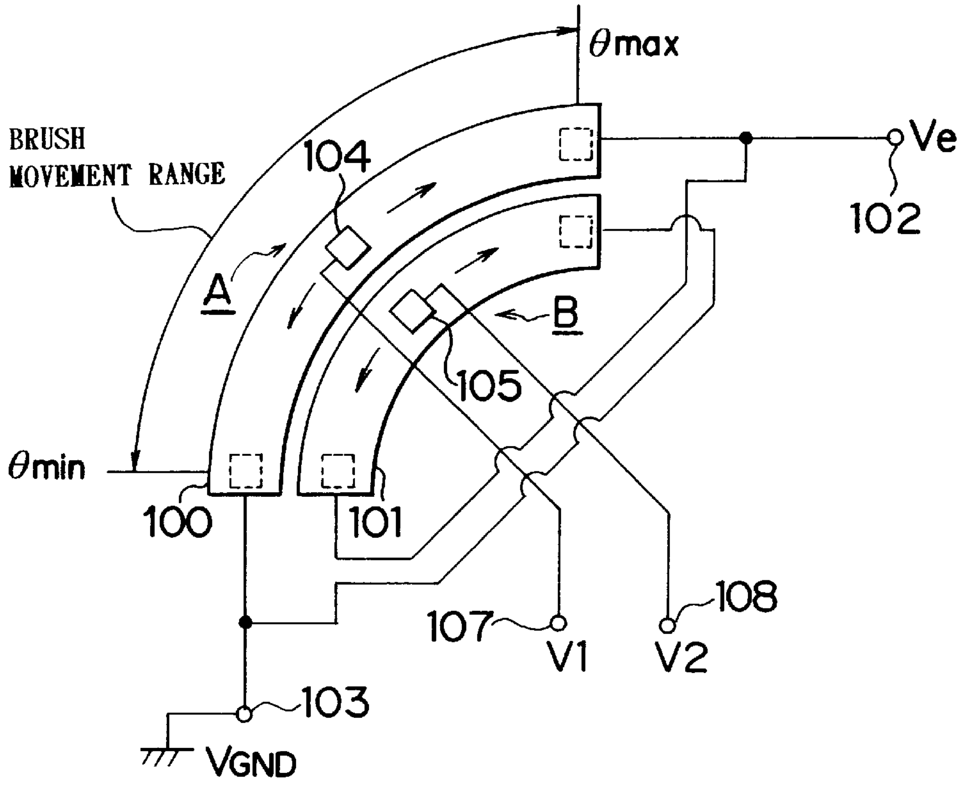
FIG. 13 RELATED ART
FIG. 13 is a schematic diagram of a throttle sensor according to a related art technology.
Figure 14:
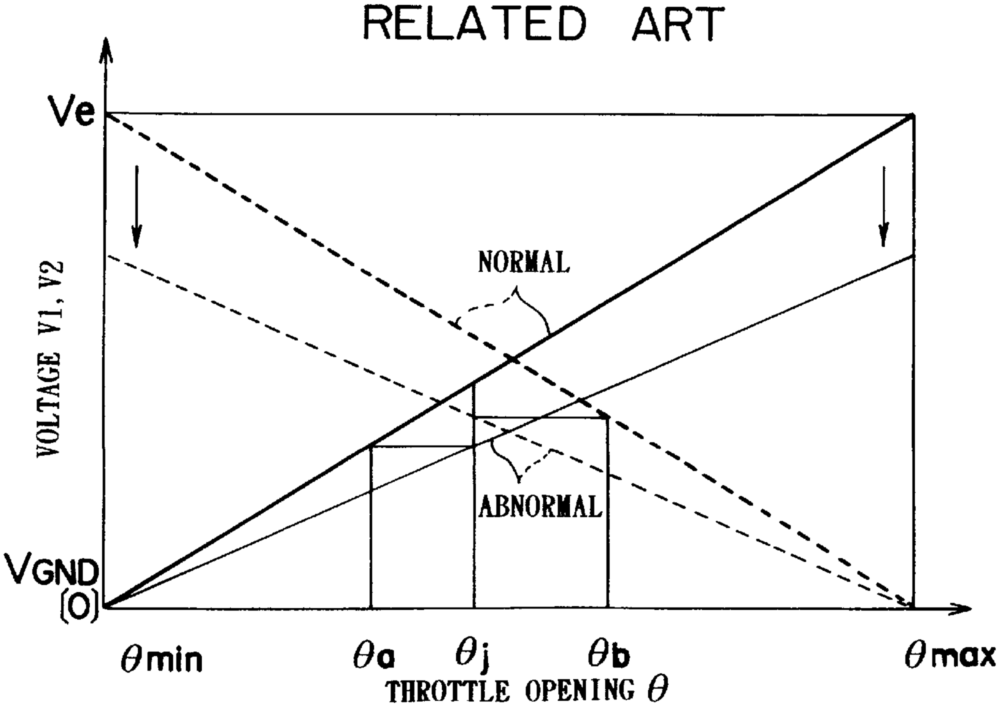
FIG. 14 RELATED ART
FIG. 14 is a graph indicating the relationships between the throttle opening and the voltage signals where there is a decrease in the supply voltage in the related art throttle sensor.
Figure 15:
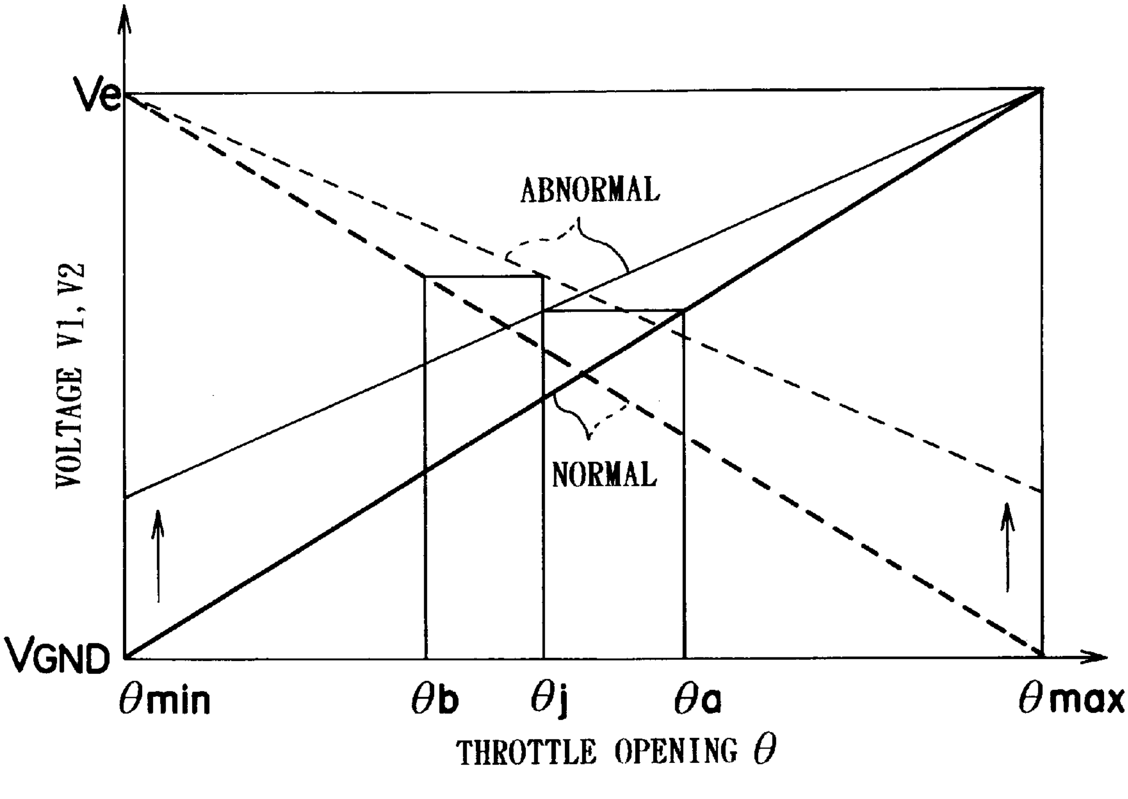
FIG. 15 RELATED ART
FIG. 15 is a graph indicating the relationships between the throttle opening and the voltage signals where there is an increase in the ground voltage in the related art throttle sensor.
Figure 16:
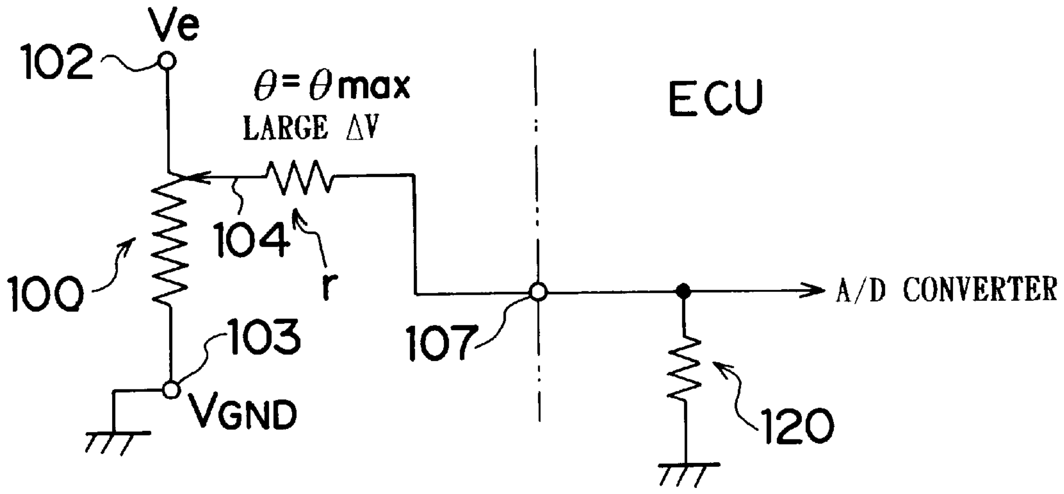
FIG. 16 RELATED ART
FIG. 16 is an electric circuit diagram of an output signal generator portion in the related art throttle sensor.
Figure 17:
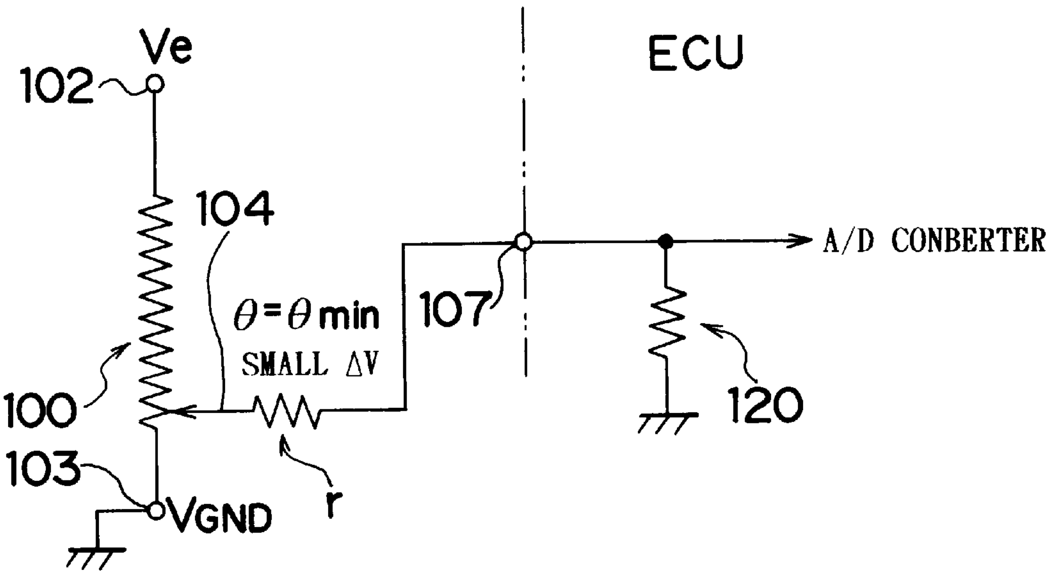
FIG. 17 RELATED ART
FIG. 17 is another electric circuit diagram of the output signal generator portion in the related art throttle sensor

It is also possible to set equal rates of changes k1, k2 by reducing the rate of change k2 as indicated by a one-dot line in FIG. 10. The rate of change k2 can be reduced by reducing the length L2 of the conducting portion 31. With such a modification to the output characteristics, an abnormality can also be detected in substantially the same manner as in the first embodiment.

However, if the rate of change k2 is reduced in this manner, the detection precision tends to decrease regarding the detection of an increase in the ground voltage VGND as an abnormality, because of the following reason. That is, if the ground voltage VGND increases, the difference Δθ(=θ1−θ2') provided by the construction wherein the rate of change k2 is reduced becomes smaller than the difference Δθ (=θ1−θ2) provided by the throttle sensor 15 of the first embodiment, as clearly indicated in FIG. 10.

An increase in the ground voltage VGND is caused not only by an increase in the contact resistance at a connector or the like as described above, but also by an increase in the current through the grounded side. Therefore, an increase in the ground voltage VGND is considered to occur more frequently than other abnormalities in throttle sensors.

The first embodiment is particularly advantageous in this respect. Since the set rates of change k1, k2 are not equal to each other but the rate of change k2 set for the second output signal generator portion 27 is greater than the rate of change k1 set for the first output signal generator portion 26, the first embodiment provides a relatively large difference Δθ between the throttle openings corresponding to the voltage signals from the output signal generator portions 26 and 27 when there is an increase in the ground voltage VGND. Therefore, it is possible to detect an increase in the ground voltage VGND with a high precision according to the first embodiment.

The foregoing embodiments may also be modified as described below.

Although in the foregoing embodiments, the resistor pattern 21 of the second output signal generator portion 27 is provided with the extension 30 so that the voltage signal V2 of the second output signal generator portion 27 becomes the offset voltage Voff higher than the ground voltage VGND when the throttle opening θ is the minimum opening θmin, it is also possible to omit the extension 30 and provide a separate resistor having a resistance similar to that of the extension 30, between the resistor pattern 21 and the ground terminal 33.

Although in the foregoing embodiments, the rate of change k2 of the voltage signal V2 of the second output signal generator portion 27 is greater than the rate of change k1 of the voltage signal V1 of the first output signal generator portion 26, it is also possible to set the rates of change k1, k2 to equal values or set the rate of change k2 for the second output signal generator portion 27 to a value that is less than the value of the rate of change k1 for the first output signal generator portion 26.

Although in the foregoing embodiment, the invention is applied to throttle sensors, the invention can also be applied to other linear position sensors such as an accelerator pedal sensor in an electronic throttle control system and the like. Furthermore, the linear position sensor of the invention can also be applied not only to sensors for detecting the position of an object that rotates or turns but also to sensors for detecting the position of an object that linearly moves.

Although in the foregoing embodiments, the output signals from the output signal generator portions provided in the sensor are inputted to the electronic control unit so as to detect a sensor abnormality, it is also possible to provide an abnormality detector within in the sensor.

While the present invention has been described with reference to what are presently considered to be preferred embodiments thereof, it is to be understood that the invention is not limited to the disclosed embodiments or constructions. To the contrary, the invention is intended to cover various modifications and equivalent arrangements.

What is claimed is:

1. A linear position sensor comprising at least two output signal generator portions each including:

a resistor band; and a slider provided for sliding movement on the resistor band that follows a positional change of a detection object, each of the at least two output signal generator portions outputting a voltage signal in accordance with a position of the detection object using the slider, the resistor band of each of the at least two output signal generator portions being connected at one end thereof to a power source, and the other end of each resistor band being grounded, and a first output signal generator portion of the at least two output signal generator portions having an output signal characteristic relative to a positional change of the detection object such that the voltage signal outputted from the first output signal generator portion linearly increases to a supply voltage of the power source as the detection object changes in position in a predetermined direction, and a second output signal generator portion of the at least two output signal generator portions having an output signal characteristic relative to a positional change of the detection object such that as the detection object changes in position in the predetermined direction, the voltage signal outputted from the second output signal generator portion linearly increases to the supply voltage of the power source and remains at the supply voltage despite a further positional change of the detection object in the predetermined direction.

2. A linear position sensor according to claim 1, wherein the voltage signal increases to the supply voltage in accordance with a positional change of the detection object from an initial position.

3. A linear position sensor according to claim 1, wherein the one end of the resistor pattern of each of the output signal generator portions is connected to a common power source.

4. A linear position sensor according to claim 1, wherein as the detection object changes in position in the predetermined direction, the voltage signal outputted from the second output signal generator portion linearly increases from a voltage higher than the ground voltage to the supply voltage while always remaining greater in value than the voltage signal outputted from the first output signal generator portion.

5. A linear position sensor according to claim 1, wherein as the detection object changes in position in the predetermined direction, the voltage signal outputted from the second output signal generator portion linearly increases to the supply voltage at a linear change rate that is greater than a linear change rate of the voltage signal outputted from the first output signal generator portion.

6. A linear position sensor according to claim 1, further comprising a conductor connected to the resistor band of the second output signal generator portion so that as the detection object moves to a predetermined position in the predetermined direction, the voltage signal outputted from the second output signal generator portion linearly increases to the supply voltage, and so that when the detection object moves further from the predetermined position in the predetermined direction, the voltage signal outputted from the second output signal generator portion remains at the supply voltage.

7. A linear position sensor according to claim 1, wherein the linear position sensor is used to detect an opening of a throttle valve that is used to control an output of an internal combustion engine.

8. A linear position sensor according to claim 7, wherein the voltage signal outputted from the second output signal generator portion remains at the supply voltage when the throttle valve moves from a position corresponding to a predetermined opening that is less than a maximum opening, toward a position corresponding to the maximum opening.

9. A linear position sensor comprising:

at least two output signal generator portions each including a resistor band, and a slider provided for sliding movement on the resistor band that follows a positional change of a detection object, each of the at least two output signal generator portions outputting a voltage signal in accordance with a position of the detection object using the slider, the resistor band of each of the at least two output signal generator portions being connected at one end thereof to a power source, and the other end of each resistor band being grounded, and a first output signal generator portion of the at least two output signal generator portions having an output signal characteristic relative to a positional change of the detection object such that the voltage signal outputted from the first output signal generator portion linearly increases to a supply voltage of the power source as the detection object changes in position in a predetermined direction, and a second output signal generator portion of the at least two output signal generator portions having an output signal characteristic relative to a positional change of the detection object such that as the detection object changes in position in the predetermined direction, the voltage signal outputted from the second output signal generator portion linearly increases to the supply voltage of the power source and remains at the supply voltage despite a further positional change of the detection object in the predetermined direction; and a detection portion that detects an abnormality of the linear position sensor by comparing positions of the detection object corresponding to the voltage signal from each of the at least two output signal generator portions.

10. A linear position sensor for detecting opening of a throttle valve that is used to control an output of an internal combustion engine, the linear position sensor comprising at least two output signal generator portions each including:

a resistor band; and a slider provided for sliding movement on the resistor band that follows a positional change of a detection object, each of the at least two output signal generator portions outputting a voltage signal in accordance with a position of the detection object using the slider, the resistor band of each of the at least two output signal generator portions being connected at one end thereof to a power source, and the other end of each resistor band being grounded, and a first output signal generator portion of the at least two output signal generator portions having an output signal characteristic relative to a positional change of the detection object such that the voltage signal outputted from the first output signal generator portion linearly increases to a supply voltage of the power source as the detection object changes in position in a predetermined direction, and a second output signal generator portion of the at least two output signal generator portions having an output signal characteristic relative to a positional change of the detection object such that as the detection object changes in position in the predetermined direction, the voltage signal outputted from the second output signal generator portion linearly increases to the supply voltage of the power source and remains at the supply voltage despite a further positional change of the detection object in the predetermined direction.

* * * * *